United States Patent [19]
Taguchi et al.

[11] 4,419,743
[45] Dec. 6, 1983

[54] SEMICONDUCTOR MEMORY DEVICE

[75] Inventors: Masao Taguchi, Sagamihara; Takashi Ito, Kawasaki, both of Japan

[73] Assignee: Fujitsu Limited, Kawasaki, Japan

[21] Appl. No.: 282,266

[22] Filed: Jul. 10, 1981

[30] Foreign Application Priority Data

Jul. 18, 1980 [JP] Japan .................................. 55-98426

[51] Int. Cl.³ .......................................... G11C 11/24
[52] U.S. Cl. .................................... 365/149; 365/174; 365/190
[58] Field of Search ............... 365/149, 174, 177, 189, 365/190

[56] References Cited

U.S. PATENT DOCUMENTS 3,986,180 10/1976 Cade ..................................... 365/149
4,188,671 2/1980 Lynes .................................... 365/149

OTHER PUBLICATIONS

IBM Technical Disclosure Bulletin, vol. 21, No. 2, Jul. 1978, Anantha et al., "Method of Making 1/N Cell", pp. 601–603.
Selleck et al., "64K Dynamic 1/N Fractional Device Bipolar Memory", 1980 IEEE International Solid-State Circuits Conference, pp. 220–221.
Koyanagi et al., "Novel High Density, Stacked Capacitor MOS RAM", Japanese Journal of Applied Physics, vol. 18, 1979, Supplement 1B-1, pp. 35–42.

Primary Examiner—Joseph A. Popek
Attorney, Agent, or Firm—Staas & Halsey

[57] ABSTRACT

Disclosed is a semiconductor memory device in which dynamic cells, each comprising a capacitor and a field effect-type switching transistor, are arrayed at intersecting points of a plurality of bit lines and a plurality of word lines. Either the source electrode or the drain electrode of the transistor is connected to a reference potential line, the other electrode being connected to an electrode of the capacitor. The bit line is commonly connected to the other electrode of the capacitors of a plurality of memory cells arrayed along the bit line. The word line is commonly connected to the gate electrodes of the switching transistors of the plurality of memory cells arrayed along the word line, and the area of the capacitor is greater than the electrode area of a portion where the transistor is connected to the capacitor.

11 Claims, 16 Drawing Figures

Fig. 6A
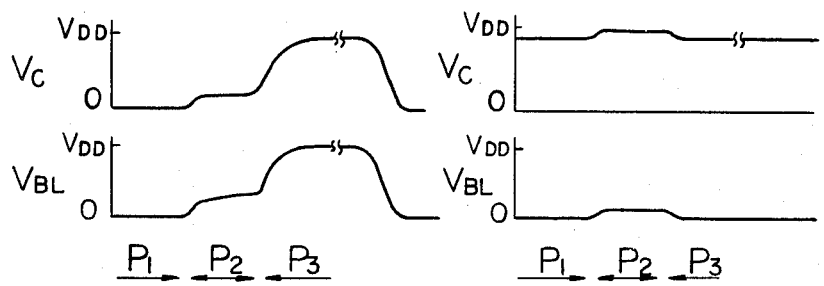
Fig. 6B
Fig. 6C
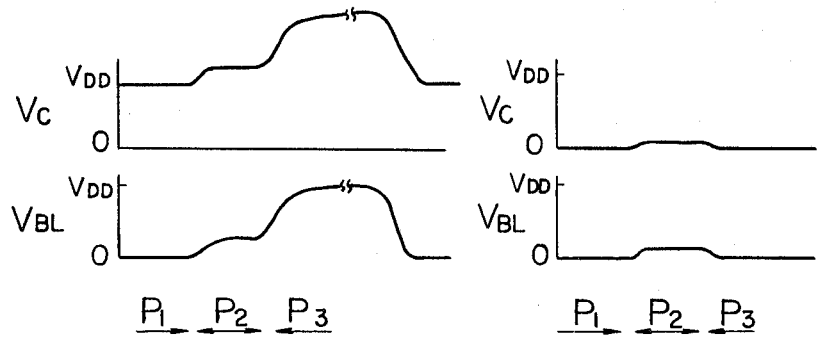
Fig. 6D

SEMICONDUCTOR MEMORY DEVICE

BACKGROUND OF THE INVENTION (1) Field of the Invention

The present invention relates to a semiconductor device, and more specifically to a semiconductor memory device of a so-called one-transistor-type having a capacitor element per one memory unit, and a field effect transistor which is connected in series with the capacitor element.

(2) Description of the Prior Art

The one-transistor-type dynamic memory has hitherto usually been developed in such a manner that an MOS field effect transistor serves as a switching transistor. A representative dynamic memory of this type consists of an MOS transistor and an MOS capacitor which is disposed on an extension of the drain electrode (or source electrode) of the MOS transistor. The MOS capacitor consists of a polycrystalline silicon layer which serves as one electrode, an inversion layer which is formed on the surface of a silicon semiconductor substrate and which serves as another electrode, and a dielectric film which is interposed therebetween. On the other hand, the source electrode (or drain electrode) of the MOS transistor is connected to a bit line, the gate electrode is connected to a word line, and another electrode of the MOS capacitor is connected to a constant potential supply.

The data storing mechanism of the memory cell of the above-mentioned construction works based upon the presence or absence of the electric charge accumulated in the MOS capacitor element. By detecting the presence or absence of the electric charge, the stored data can be taken to the external units. Therefore, the capacitor element should be capable of storing as much electric charge as possible, the electric charge should be detected as effectively as possible when the data is to be read, and the parasitic capacity of the bit lines should be kept as small as possible.

The output voltage applied to the bit line, however, decreases with the increase in the degree of memory integration and with the increase in the number of cells per bit line. To prevent this inconvenience, therefore, attempts having been made to decrease the parasitic capacity of the bit lines and to increase the areas of the MOS capacitor. For example, it has been known that the parasitic capacity relative to ground decreases, and the output voltage of the cell increases, if the bit lines are formed by using a metal layer, instead of relying upon high impurity concentration regions which form the source and drain electrodes of the MOS transistor. It has also been attempted to stack the capacitors and MOS transistors in a three-dimensional manner to increase the storage capacity of a memory cell which has a limited area. The cells produced by this method are usually called stack-type cells. According to this method, the reduction in the cell area enables the bit line to be shortened and, eventually, the parasitic capacity to be reduced.

The defect of the stack-type cell is that a bit line must be wired over a portion having a large step which results from the multi-layer structure. As the distance between the neighboring cells is reduced, the inclination of the bit line becomes steep; and the bit line tends to be easily broken. Therefore, even if it is attempted to reduce the areas of unit cells of a multi-layer construction, space must be provided among the neighboring cells to such a degree that the wiring will not break. Therefore, a limitation is imposed on the degree of integration.

SUMMARY OF THE INVENTION

An object of the present invention is to provide a semiconductor memory cell which can be easily produced and which has a large capacity.

Another object of the present invention is to provide a semiconductor memory cell in which the metal wiring does not break so easily.

A further object of the present invention is to provide a semiconductor memory cell which can be highly and densely integrated.

In order to achieve the above-mentioned objects, the present invention concerns a semiconductor memory device in which dynamic memory cells, each comprising a capacitor and a field effect-type switching transistor, are arrayed at intersecting points of a plurality of bit lines and a plurality of word lines, wherein either the source electrode or the drain electrode of the transistor is connected to a reference potential line, with the other electrode being connected to an electrode of the capacitor. The bit line is commonly connected to the other electrode of the capacitors of a plurality of memory cells arrayed along the bit line, the word line is commonly connected to the gate electrodes of the switching transistors of the plurality of memory cells arrayed along the word line, and the area of the capacitor is greater than the electrode area of a portion where the transistor is connected to the capacitor.

Further features and advantages of the present invention will become apparent from the ensuing description with reference to the accompanying drawings to which, however, the scope of the invention is in no way limited.

BRIEF DESCRIPTION OF THE DRAWINGS

FIGS. 5A, 5B, and 6A through 6D are time charts for describing the operation of the semiconductor memory cell of FIG. 4;

DESCRIPTION OF THE PREFERRED EMBODIMENTS

Figure 1:
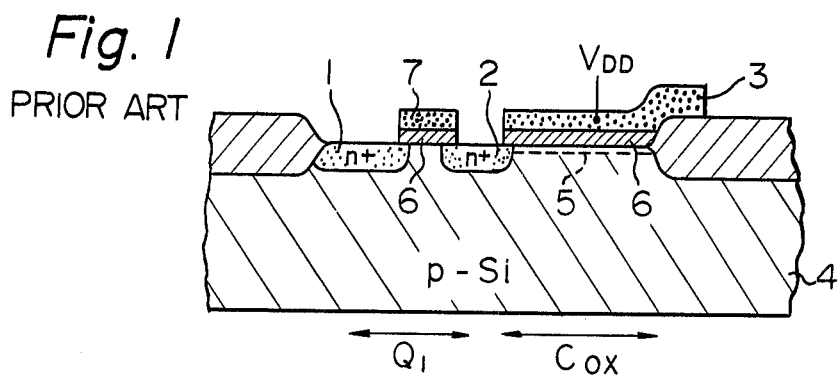
FIG. 1 is a section view illustrating a prior art dynamic semiconductor memory cell.

FIG. 1 is a sectional view of a representative memory cell, which consists of an MOS transistor $Q_1$ and an MOS capacitor $C_{ox}$ that is arrayed on an extension of a source electrode 2 of the MOS transistor $Q_1$. The MOS capacitor $C_{ox}$ has a polycrystalline silicon layer 3 which serves as one electrode, an inversion layer 5 which is formed on the surface of a p-type silicon semiconductor substrate 4 and which serves as another electrode, and a dielectric film (gate oxide film) 6 which is interposed therebetween. The MOS capacitor $C_{ox}$ stores most of the electric charge of the memory cell. The electrode 1 of the transistor $Q_1$, having a polycrystalline silicon layer 7 which serves as a gate electrode, is connected to a bit line, and the electrode 3 of the MOS capacitor $C_{ox}$ is connected to a constant potential supply. In operation, this potential is connected usually to the power-supply voltage $V_{DD}$ which is the largest among those used in the memory element.

Figure 2:
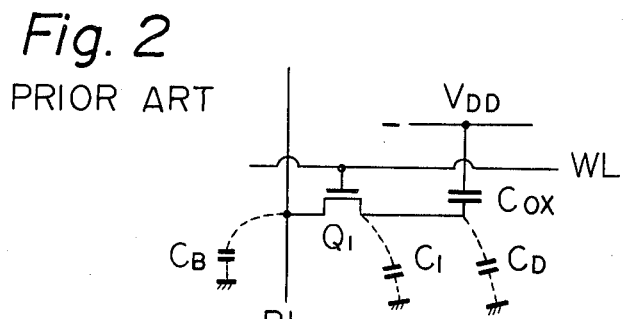
FIG. 2 is a diagram of an equivalent circuit for the memory cell of FIG. 1.

FIG. 2 shows an equivalent circuit for FIG. 1. In many cases, the bit line BL is composed of a diffusion layer which extends from a high impurity concentration region (n+-type in this case) that forms the electrode 1 of the transistor $Q_1$. Furthermore, a contact region is often formed for the electrode of the transistor $Q_1$, and a layer of metal wiring connected thereto is often used as a bit line. Alternatively, the wiring layer is often formed by polycrystalline silicon. The data storing mechanism of the thus constructed memory cell is based upon the presence or absence of the electric charge stored in the capacitor element. By detecting the presence or absence of the electric charge, the stored data can be read out to the external units. For this purpose, the parasitic capacity of the bit line should be kept as small as possible, so that a maximum of electric charge is stored in the memory cell, and the electric charge is detected as effectively as possible when the data is to be read.

The charge storing capacity of the memory cell shown in FIG. 1 is determined by the sum of an inter-electrode capacity (which is denoted by $C_{ox}$) of the MOS capacitor, a depletion layer capacity $C_D$ of the inversion layer 5 relative to the semiconductor substrate 4 (the inversion layer 5 serving as one electrode and being formed on the surface of the semiconductor substrate), and a depletion layer capacity $C_j$ at the junction portion between the electrode of the MOS transistor $Q_1$ and the MOS capacitor. That is, the charge storing capacity of the memory cell is equal to $C_{ox}+C_D+C_j$. Here, if the parasitic capacity of the electrode of the MOS transistor $Q_1$ on the side of the bit line and of a portion of bit line relative to the substrate per bit, is denoted by $C_B$, and if the number of cells on a single bit line is denoted by n, the bit line capacity is given by $nC_B+C_A$, where $C_A$ denotes an additional capacity, such as the input capacity of a sensing amplifier connected to the bit line.

When designed in an ordinary manner, the bit line BL performs the reading operation under the condition in which it is precharged to a high potential (which is nearly equal to a power-supply potential $V_{DD}$). For example, if the MOS capacitor $C_{ox}$ has zero voltage across the electrodes, i.e., if the MOS capacitor $C_{ox}$ is of the n-channel type, it could be presumed that the MOS capacitor is in the condition of being filled with electrons. Therefore, if the transfer transistor $Q_1$ is selected and is turned on, the electric charge is distributed again between the electric charge which has been precharged in the bit line BL and the MOS capacitor, and the potential of the bit line BL is slightly decreased. Since there exists a relation $nC_B+C_A >> C_D+C_j+C_{ox}$, the decrement $\Delta V$ is determined by the following relation, $$\Delta V = \frac{C_D + C_j + C_{ox}}{C_D + C_j + C_{ox} + nC_B + C_A} \times V_c \quad (1)$$

where $V_c$ denotes a maximum voltage charged in the MOS capacitor. With a cell of the construction shown in FIG. 1, the maximum voltage $V_c$ is determined by the relation, $$V_c = V_{DD} - V_{th} \quad (2)$$

unless some contrivance is made, such as constructing the capacitor portion in the depletion type. In the above relation (2), $V_{th}$ denotes a threshold value at which an inversion layer is formed on the MOS transistor. In the case of the connection, such as the MOS capacitor $C_{ox}$, which is subject to be affected by the substrate bias, the threshold value $V_{th}$ becomes greater than a threshold value of a source-grounded MOS transistor.

With a large-capacity memory having many cells, the change in voltage which develops in the bit line becomes very small due to a large parasitic capacity of the bit line, as indicated by the above equation (1). Further, the voltage $V_c$ cannot fully comply with the amplitude of the power-supply voltage $V_{DD}$ as far as one electrode of the MOS capacitor $C_{ox}$ is composed of the inversion layer 5. In order for the voltage $V_c$ to fully comply with the amplitude of the power-supply voltage, the threshold value must be converted into a negative value (n-channel type) by introducing impurities of the same type of conductivity as the source and drain electrodes of the MOS transistor, into the surface of the semiconductor substrate of the MOS capacitor.

The output voltage applied to the bit line decreases with the increase in the integration degree of memories and with the increase in the number of cells n per one bit line. To prevent this tendency, therefore, the design has been so contrived as to reduce the parasitic capacity $C_B$ of the bit line BL and to increase the area of the MOS capacitor $C_{ox}$. For example, if the bit line BL is formed by a metal layer, instead of by high impurity concentration regions that form the source and drain electrodes of the MOS transistor $Q_1$, the parasitic capacity relative to ground (this bears nearly the same meaning as the parasitic capacity relative to the substrate, but also covers the capacity which equivalently includes capacitive coupling portions relative to wirings in addition to the substrate) decreases, and the output voltage of the cell increases. It has also been attempted to stack the capacitor portion and the MOS transistor portion in a three-dimensional manner in order to increase the storage capacity of a memory cell of limited areas. According to this method, the bit line is shortened, due to the decrease in the cell area, and the parasitic capacity is reduced.

Figure 3:
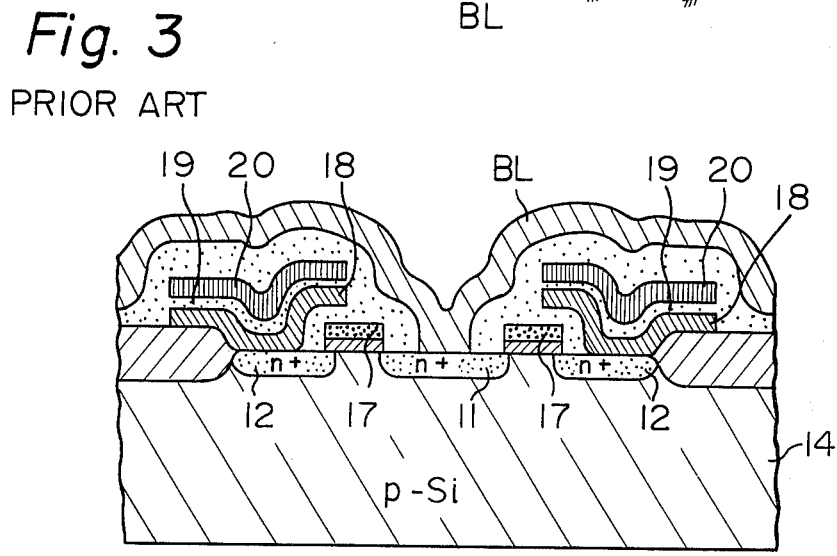
FIG. 3 is a section view illustrating a conventional dynamic semiconductor memory cell of improved construction.

FIG. 3 is a sectional view of a memory cell which incorporates all of the above-mentioned improvements. The memory cell of this type is usually referred to as a stack-type memory. In the cell of this type, the capacitor is not of the MOS type in which the inversion layer serves as an electrode. Namely, the capacitor is an ordinary one which consists of a polycrystalline silicon layer 18 that is connected to the drain 11 or the source 12 of the MOS transistor, a dielectric film 19 such as, for example, $Si_3N_4$ formed on the polycrystalline silicon layer 18, and a polycrystalline silicon layer 20 formed thereon. With the thus constructed memory cell, the charging voltage is not decreased by a quantity of the threshold value, and the data can be written up to the power-supply voltage $V_{DD}$. Further, due to the three-dimensional construction, the capacitor is allowed to occupy the areas above the MOS transistor portion. Namely, the second and third polycrystalline silicon layers 18, 20 which serve as capacitor electrodes can be stretched up to the upper portion of the first polycrystalline silicon layer 17 that serves as a gate electrode of the transistor. Accordingly, there is no need of reducing the thickness of a dielectric film 19, as compared with a thermally oxidized film on the single crystalline silicon. Moreover, a very great electric charge can be stored if the dielectric film 19 is made of a material having a large specific inductive capacity.

However, the defect of the static-type cell thus constructed, or constructed based upon the above technical idea, is that the bit line BL must be formed on a place having a large step, which results in the multi-layer construction. Namely, if the polycrystalline silicon layers 17, 18 and 20 each have a thickness of 3000 angstroms, and if the insulation layers among the above layers have a thickness of 3000 angstroms, the bit line BL connected to the $n^+$-type region 11 must be wired running across a step which is about 1.5 microns. Consequently, the metal (aluminum) wiring layer used as the bit line BL tends to break. This fact deteriorates the yield of integrated circuits and further degrades the reliability of elements. FIG. 3 illustrates a cell having two symmetrical bits on the right and left sides. As the distance between the neighboring cells becomes small, the inclination of bit line BL between the cells becomes steep and the bit line BL tends to break more easily. Therefore, even if it is attempted to reduce the areas of the individual cells that are constructed in the multi-layer construction, space must be provided between the cells to such a degree that the bit line is not broken. Consequently, the cells are not as highly integrated as expected.

Figure 4:
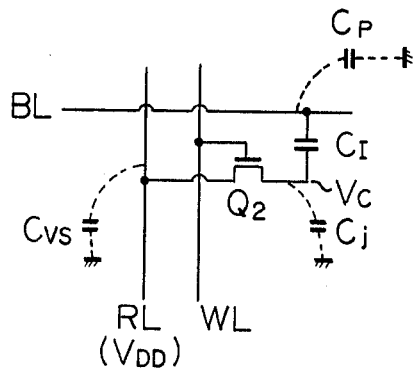
FIG. 4 is a diagram of an equivalent circuit for a dynamic semiconductor memory cell according to an embodiment of the present invention.

FIG. 4 is a diagram of an equivalent circuit which shows the fundamental design of the present invention. What makes the circuit of FIG. 4 different from the circuit of FIG. 2 is, first, that a line which had hitherto been used as a bit line is utilized as a reference potential line and is connected to a reference potential. The reference potential is usually the power-supply potential $V_{DD}$, but need not necessarily be limited thereto. Second, another electrode of the charge storing capacitor, which had hitherto been used as a power-supply line, is now used as a bit line BL which is common to all of the memory cells. The thus constructed series circuit comprising a transistor $Q_2$ and a capacitor $C_I$ can be regarded to be the same as the conventional memory cell, and operates in the same way. According to the device of the present invention, furthermore, a line, which had hitherto been used as the bit line, is utilized as the reference potential line. Therefore, a large capacity relative to the substrate does not present any defect, but rather helps to stabilize the voltage and reduce the impedance of the power supply. The data is written in and read out as mentioned below. That is, like the conventional devices, the level of the bit line BL is switched to the H (high) level which is equal to the power-supply voltage $V_{DD}$ or to the L (low) level which is equal to zero volt, the transistor $Q_2$ is rendered conductive, and the capacitor $C_I$ is electrically charged at the voltage $V_{DD}$ or until the difference becomes zero between the reference potential line RL and the volate $V_{DD}$. In the former case, the capacitor $C_I$ is electrically charged; the capacitor voltage becomes approximately $V_{DD}$, the voltage on the side of the transistor $Q_2$ being positive. In the latter case, no electric charge is stored in the capacitor $C_I$ and its potential is zero volt. The former case and the latter case corresponds to the data "0" and "1", respectively.

Figures 5A, 5B:
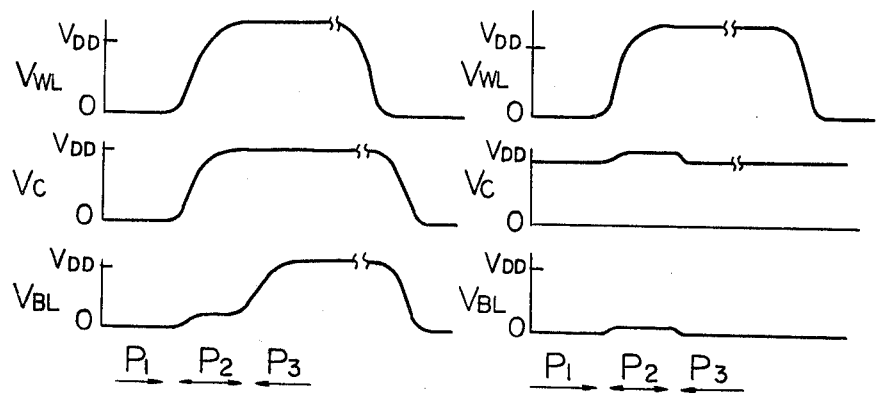

The information mentioned below is with regard to reading out the data "1" and "0" in conjunction with FIGS. 5A and 5B, in which the power-supply voltage is denoted by $V_{DD}$, and the reference potential $V_{ref}$ of the reference potential line is assumed to be equal to the power-supply voltage $V_{DD}$. This makes the situation most convenient. FIG. 5A shows the case when a cell having $V_C=0$ (data "1") is to be read out, and FIG. 5B shows the case when a cell having $V_C \approx V_{DD}$ (data "0") is to be read out. In FIGS. 5A and 5B, furthermore, $P_1$ denotes a stand-by period, $P_2$ denotes a reading period, and $P_3$ denotes a period in which the sensing amplifier is in operation. To read the data, the bit line voltage $V_{BL}$ is precharged to 0 level, permitted to assume the floating condition, and is switched to the stand-by condition. The transistor $Q_2$ is then rendered conductive. The transistor $Q_2$ is rendered conductive by using a voltage which is produced by a bootstrap circuit and which is higher than the power-supply voltage $V_{DD}$ (by at least the threshold voltage of the transistor $Q_2$). When $V_C=0$, the voltage $V_{BL}$ increases depending upon a current which flows into the bit line, as shown in FIG. 5A. The increase in the voltage $V_{BL}$ is amplified by the sensing amplifier to produce the data "1". When $V_C=V_{DD}$, a very small current flows into the bit line, as represented by $V_{BL}$ of FIG. 5B. The increase in the voltage, therefore, is judged by the sensing amplifier to be zero; i.e., the data "0" is produced.

Next, changes in the node voltage accumulated in the non-selected cells will be mentioned below with reference to FIGS. 6A through 6D, in which the cells are all in the non-selected condition. Therefore, the voltage of the word line WL of the transistor $Q_2$ is zero, and $P_1$ denotes a stand-by period, $P_2$ denotes a period in which other cells are being read out on the same bit line, and $P_3$ denotes a period in which the sensing amplifier is in operation. FIG. 6A shows the case where the non-selected cells have $V_C=0$ (data "1") and where other cells (having $V_C=0$) are read out on the same bit line. FIG. 6B shows the case where the non-selected cells have $V_C=V_{DD}$ (data "0") and where other cells (having $V_C \approx V_{DD}$) are read and selected on the same bit line. FIG. 6C shows the case where the non-selected cells have $V_C \approx V_{DD}$ (data "0") and where other cells (having $V_C \approx V_{DD}$) are read out on the same bit line. FIG. 6D shows the case where the non-selected cells have $V_C=0$, and where other cells (having $V_C=0$) are read out on the same bit line. Ideally, the node voltage accumulated in the non-selected cells should not undergo variation when other cells are being read out on the same bit line. As shown in FIGS. 6A through 6D, however, the voltages $V_C$ all undergo variation, depending upon the change in the bit line voltage $V_{BL}$. However, no problem exists since the voltages return to the initial values after the reading period $P_2$ is finished. In the case of FIG. 6C, however, the accumulated node voltage $V_C$ becomes nearly equal to $2V_{DD}$. Therefore, the junction between the drain of a transistor and the substrate must be able to withstand a sufficiently large voltage.

Figure 7A:
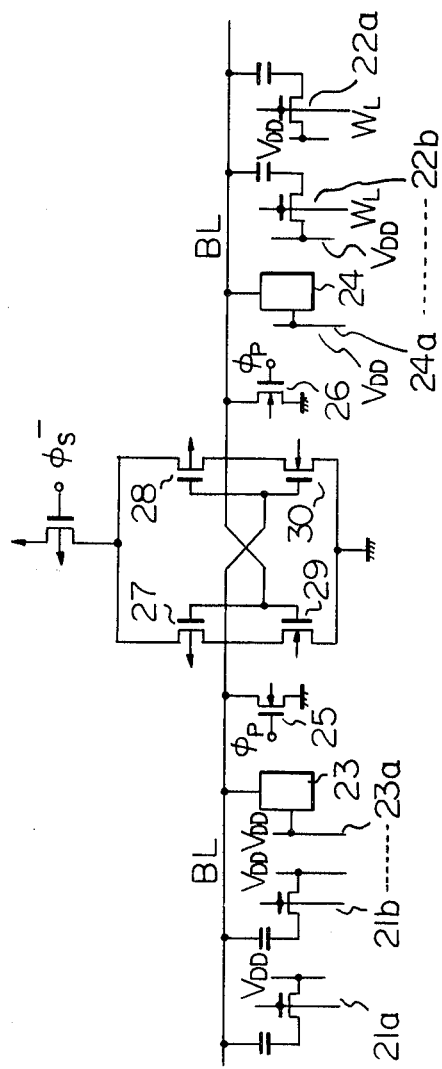
FIG. 7A is a circuit diagram of a read amplifier employing the semiconductor memory cells according to the present invention.
Figure 7B:
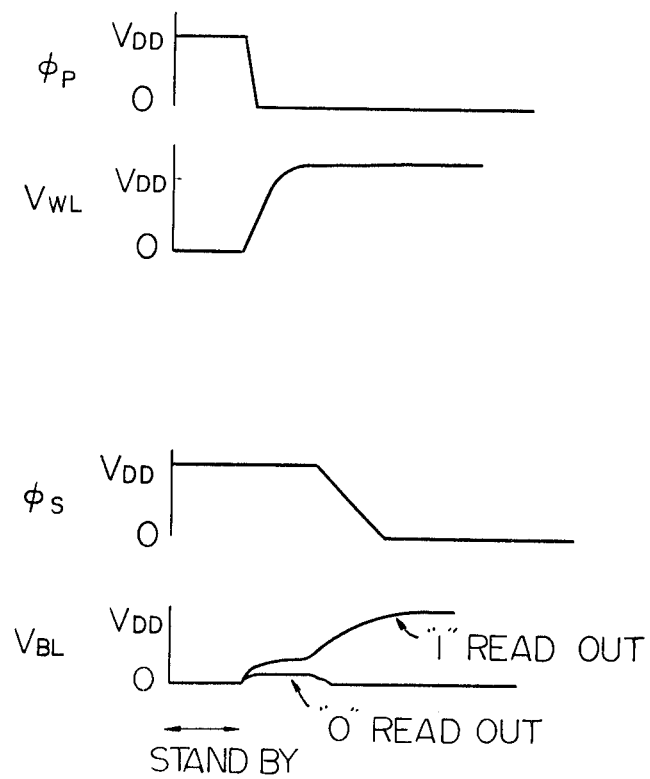
FIG. 7B is a timing chart for describing the operation of the circuit of FIG. 7A.

FIG. 7A illustrates a sensing amplifier employing C-MOS transistors, in which reference numerals 21a, 21b, 21b, ..., 22a, 22b... denote memory cells, 23a and 24a denote dummy cells, 25 and 26 denote transistors for setting the initial bit-line potentials, and 27 to 30 denote transistors that constitute the sensing amplifier. FIG. 7B illustrates the operation waveforms of a major portion of the circuit of FIG. 7A. As mentioned already, the data is read by precharging the bit line BL to 0 level, permitting the bit line BL to float, and turning on the transistor of the cell. When the capacitor of the cell has an electric charge, there is no change in the potential of the bit line; the level 0 is maintained since the capacitor is already charged up. On the other hand, when the capacitor has no electric charge, the electric charge is charged in the capacitor and in the bit line capacity from the reference potential line at a potential of $V_{DD}$; therefore, the bit line BL assumes a potential which is determined by the ratio of these capacities and by the voltage $V_{DD}$. The electric charge is also distributed in the same manner, even on the side of the dummy cell. Here, however, the capacity of the capacitor of the dummy cell is one-half that of the memory cell and, hence, the change in potential is nearly halved. The potential difference is amplified by the sensing amplifier, and the bit line potentials of the memory cell and the dummy cell are fed to the data bus as the read-out output.

It is of course possible, even with the memory cell of FIG. 1, to replace the bit line by the line for capacitor electrodes. Performance, however, is deteriorated. Namely, when the power-supply line is substituted for the bit line in the construction of FIG. 1, the parasitic capacity of the bit line relative to the substrate for a unit memory cell is given by a series capacity of $C_{ox}$ and $(C_D+C_j)$ as will be obvious from the equivalent circuit of FIG. 2, i.e., given by a relation, $$C_{ox}(C_D+D_j)/C_{ox}+C_D+C_j). \quad (3)$$

The relation (3) becomes $C_D+C_j$ since the following relation is assumed.

$$C_{ox}>>C_j+C_D \quad (4)$$

Namely, the capacity consists chiefly of a depletion layer capacity $C_D$ of the capacitor portion having large areas. Therefore, if this value is compared with $C_B$ the value becomes greater than the bit line capacity $C_B$. When the bit line is replaced by the power-supply line in FIG. 1, therefore, the parasitic capacity of the bit line increases strikingly, as compared with the situation where the bit line is not replaced by the power-supply line. Therefore, performance is deteriorated when the bit line is replaced by the power-supply line.

Figure 8A:
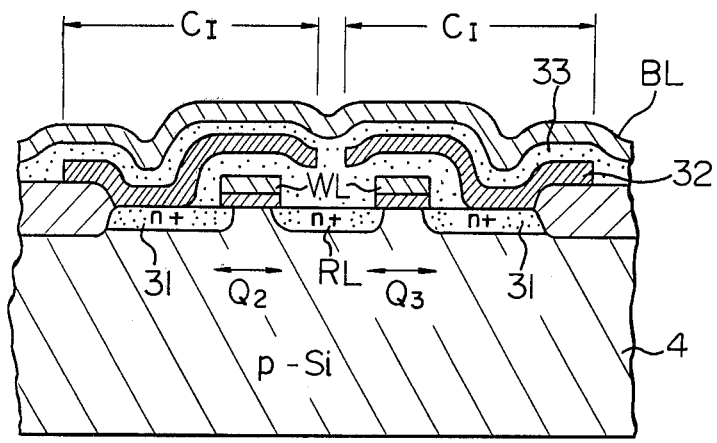
FIG. 8A is a sectional view and FIG. 8B is a plan view of the semiconductor memory cell according to an embodiment of the present invention in which a bit line is composed of a metal wiring of the uppermost layer.
Figure 8B:
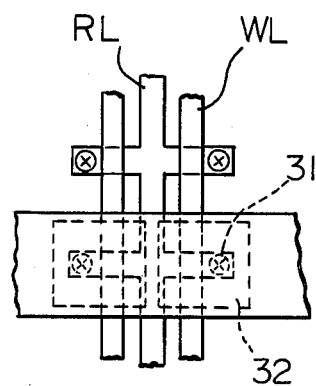

FIG. 8A is a sectional view of a cell for two bits according to an embodiment of the present invention, and FIG. 8B is a plan view thereof. The device of this embodiment has a construction resembling the stacked-type construction, in which the capacitor $C_I$ covers a switching transistor $Q_2$ to increase the capacitor area. The capacitor $C_I$ comprises a polycrystalline silicon layer 32 which is a second layer, a dielectric film 33 formed on the silicon layer 32, and a layer of metal wiring formed on the dielectric film 33. The wiring layer is utilized as the bit line BL which commonly forms electrode of each of the capacitors in a group of memory cells. A polycrystalline silicon layer which is a first layer forms a gate electrode of the transistor $Q_2$; the first polycrystalline silicon layer is stretched in a direction to cross the bit line BL and is utilized as a word line WL. A central n+-type region, which is commonly utilized by the transistors $Q_2$ and $Q_3$, serves as reference potential line RL which stretches in parallel with the word line WL.

With the thus constructed dynamic RAM, the bit line BL is successively connected to the electrodes of the capacitors $C_I$ located above each of the transistors $Q_2$. Therefore, the bit line BL need not run over large steps (this fact will be obvious from the comparison with FIG. 3) and is not broken. Further, the memory cell can be constructed requiring one polycrystalline silicon layer and two aluminum layers, without any contact point on the bit line which is formed by a metal layer.

In the memory cell of FIG. 8A, the capacitor portion $C_I$ does not employ the inversion layer and does not correspond to the capacity $C_D$ of FIG. 2. Namely, in the memory cell of FIG. 8, $C_D$ is zero, and from the equivalent circuit of FIG. 4, the parasitic capacity $C_B'$ of the bit line per one bit is given by, $$C_B'=C_I C_j/(C_I+C_j)+C_p \quad (5)$$

where $C_p$ denotes a parasitic capacity between the gate and the source or the drain of the MOS transistor. In the equation (3), $C_p$ was neglected. Although it also depends upon the construction, $C_p$ is smaller than a first term of the equation (5). Therefore, if $C_p$ is neglected, and if the condition $C_I>>C_j$ is introduced, the equation (5) can be written as $C_B'\approx C_j$. According to the device of the present invention, therefore, the bit line capacity does not increase, even when the bit line is replaced by the reference potential line (which is usually referred to as cell plate from the viewpoint of its construction), unlike the conventional memory cell which is shown, for example, in FIG. 1.

With the memory cell constructed according to the present invention, the storage capacity apparently becomes slightly smaller than the capacity of the capacitor $C_I$. This fact will be mentioned below, together with the operation of the memory cell of the present invention in conjunction with FIG. 4. The reference potential line RL is fixed to such a value that is most convenient from the standpoint of operating the switching transistor $Q_2$, i.e., it is fixed to the power-supply potential $V_{DD}$ in this embodiment. In order to set the ground potential to zero and to electrically charge the capacitor $C_I$, the potential of the bit line BL is, first, set to zero, the switching transistor $Q_2$ is rendered conductive, and the voltage $V_{DD}$ is applied across both terminals of the capacitor $C_I$. When the potential of the bit line BL is raised to $V_{DD}$, after the transistor $Q_2$ has been rendered nonconductive, the potential of the electrode (drain electrode in this case) 31 of the transistor $Q_2$ on the side of the capacitor, rises to about $2V_{DD}$. Strictly speaking, this value is given by $V_{DD}+[C_I/(C_I+C_j)]V_{DD}$, since it loses the electric charge by the amount for charging the capacity $C_j$ which is a parasitic capacity of the drain region 31 relative to ground. In order for the capacitor $C_I$ not to be electrically charged, on the other hand, the potential of the bit line BL should be raised to $V_{DD}$ to make the potential difference zero relative to the reference potential line RL. Even when the transistor $Q_2$ is rendered conductive under this condition, the voltage (across the two electrodes) of the capacitor $C_I$ remains zero, since there is no potential difference across the electrodes of the capacitor $C_I$. Then, when the potential of the bit line BL is dropped to zero after the transistor $Q_2$ has been rendered nonconductive, the potential of the electrode 31 of the transistor $Q_2$ on the side of the capacitor remains at $[C_j/(C_I+C_j)]$ due to the presence of $C_j$, and is not permitted to drop to zero. This reduction of voltage swing is the reason for the effective storing capacity to be somewhat less than $C_I$ itself.

To effect the reading operation, the bit line BL is precharged to zero volts and is then permitted to float. In the dynamic memories, in general, the bit line is precharged to the voltage $V_{DD}$. According to the memory of the present invention, however, the bit line is precharged to zero volts or to a voltage close to zero volts. If the bit line is precharged to $V_{DD}$ according to the present invention, the potential of the switching transistor $Q_2$ on the side of the capacitor becomes nearly $V_{DD}$ (data "0") or $2V_{DD}$ (data "1") according to the stored data, as will be obvious from the foregoing description. In order to redistribute the electric charge between the bit line and the reference potential line, therefore, the gate voltage of the transistor $Q_2$ must be at least greater than $V_{DD}+V_{th}$. Therefore, the operation is delayed by the time which is required to raise the potential of the word line WL. In order to detect very small voltages according to the present invention, the memory is provided with a flip-flop type differential sensing circuit, and the small voltage is compared with a reference voltage (generally, one-half the value of data 0 or 1) which is produced by the dummy cell to determine whether data is "0" is "1".

Even when the electric charge 0 is written between the electrodes of the capacitor $C_I$ with the bit line potential being $V_{DD}$, the sensing operation is performed under the condition in which the bit line potential is moved from preset to zero volts and is then permitted to float. In this case, since the bit line voltage, which had been $V_{DD}$ when the data was written, is moved from preset to zero volts when the data is to be read out, the potential across the electrodes of the capacitor $C_I$ assumes a value, $$\frac{C_j}{C_I + C_j} V_{DD}$$

due to the presence of the parasitic capacity $C_j$, and is not kept at zero volts. Therefore, the storing capacity $C_s'$ of the memory cell is calculated from the difference of stored charge in $C_I$ divided by the voltage swing of a bit line $V_{DD}$ given by, $$C_S = C_I\left(1 - \frac{C_j}{C_I + C_j}\right) = \frac{C_I}{1 + \frac{C_j}{C_I}} \qquad (6)$$

As will be obvious from the above equation (6), the equivalent storage capacity $C_S'$ of the memory cell becomes smaller than the practical capacity of the capacitor $C_I$ itself depending upon a ratio $C_j/C_I$. When $C_I>>C_j$, $C_j/C_I \approx 0$ and $C_B' \approx C_I$. Therefore, the parasitic capacity $C_j$ is better small (which thus far would have been better large). The parasitic capacity $C_j$ can be minimized if the area of the capacitor $C_I$, i.e., the area of the polycrystalline silicon layer 12, is selected to be greater than the area of the portion 31 at which the transistor $Q_2$ is connected to the capacitor. The elements can be easily laid out with the construction of FIG. 8A.

On the other hand, if $C_p$ is neglected in equation (5), the parasitic capacity of the bit line per cell is given by, $$C_B = \frac{C_I C_j}{C_I + C_j} \qquad (7)$$

Accordingly, the ratio $\gamma$ of bit line capacity $nC_B'$ when n cells are connected to one bit line, the storing capacity $C_B'$ is approximately given by, $$\gamma = \frac{nC_B'}{C_S} = \frac{nC_j}{C_I} \qquad (8)$$

where the input capacity of the sensing amplifier is not taken into consideration. The above equation gives an output voltage (bit line voltage) $\Delta V_{BL}$ of the cell during the sensing operation, which is given by the following equation, $$\Delta V_{BL} = \frac{C_I V_{DD}}{C_I + \gamma C_I} = \frac{C_I V_{DD}}{C_I + nC_j} \approx \frac{C_I V_{DD}}{nC_j} \qquad (9)$$

The above equation (9) teaches that the output voltage increases with the decrease in the number of bits n, with the decrease of the parasitic capacity $C_j$ and with the increase of the capacity $C_I$.

Below the degree of performance realized by the memory which is constructed as shown in FIG. 8 is mentioned. If approximated in terms of a one side step junction near the depletion layer, the electric charge $\Delta Q$ stored in the junction capacity of a pn junction, relative to the voltage $V_{DD}$, is given by, $$\Delta Q = \int_0^{V_{DD}} \sqrt{\frac{\epsilon q N_A}{2(V - V_{sub} + \phi_D)}}\, dV = \qquad (10)$$

$$\sqrt{2\epsilon q N_A}\left\{\sqrt{V_{DD} - V_{sub} + \phi_D} - \sqrt{\phi_D - V_{sub}}\right\}$$

Further, the equivalent junction capacity $C_j$ is given by, $$C_j = \frac{Q}{V_{DD}} \qquad (11)$$

In the above equation (10), $\epsilon$ represents a dielectric constant of a semiconductor depletion layer. In the case of silicon, the dielectric constant $\epsilon$ is $1.0625 \times 10^{-10}$[F/m]. In the above equation (10), furthermore, symbol q denotes a unit electric charge, $V_{sub}$ denotes a substrate bias voltage with ground potential as a reference, $\phi_D$ is a diffusion potential of a pn junction, and $N_A$ denotes a density of majority carriers of the semiconductor substrate. For example, when the silicon substrate having a majority carrier concentration $N_A = 1 \times 10^{16}$[cm$^{-3}$] is used, with the power-supply voltage $V_{DD}$ being 5 volts and the substrate bias voltage $V_{sub}$ being $-2$ volts, the junction capacity $C_j$ becomes $1.29 \times 10^{-4}$[F/m$^2$]. When tantalum tetroxide (Ta$_2$O$_5$), obtained by oxidizing tantalum, is used as a dielectric member 33 of the capacitor $C_I$, the specific inductive capacity is 26 ("TECHNIQUE FOR IC MOUNTING", p. 59, compiled by the Japanese Association of Microelectronics, published by Kogyo Chosakai, 1979). Therefore, if the thickness of a dielectric member 33 is 500 angstroms, the capacity $C_I$ can be calculated to be $4.6 \times 10^{-3} [F/m^2]$. With the construction of FIG. 8, if the area of the capacitor portion $C_I$ is set to be three times as large as the area of the parasitic junction portion 31, the area ratio being denoted by $S_I/S_j$, and if the number n of cells per bit line is 512, the input voltage $\Delta V_{BL}$ to the sensing amplifier is given, from the equation (9), as, $$\Delta V_{BL} = \frac{\left(\frac{S_I}{S_j}\right) C_I V_{DD}}{nC_j} = \frac{3 \times 4.6 \times 10^{-3} \times 5}{512 \times 1.29 \times 10^{-4}} \, 1.04 [V] \quad (12)$$

According to the present invention, a very large output voltage is obtained in contrast with the voltage $\Delta V_{BL}$ of about 0.2 volts of the conventional memory. Generation of such a large output is chiefly attributed to the use of a film 33 having a large dielectric constant for the capacitor $C_I$. For example, if $SiO_2$ is used as a dielectric film 33 having a thickness of 500 angstroms, the capacity $C_I$ becomes $6.55 \times 10^{-4} [F/m^2]$, and the voltage becomes, $$\Delta V_{BL} = \frac{3 \times 6.55 \times 10^{-4} \times 5}{512 \times 1.29 \times 10^{-4}} = 0.149 [V] \quad (13)$$

When the number of memory cells on a bit line is 512, and if the columns, each comprising 512 memory cells, are arrayed on both sides of the sensing amplifier to form a matrix having 1024 rows, a so-called 1 megabit (1,048,576 bits) memory is realized. Even in this case, the output voltage given by the equations (10), (11) serves as a sufficiently large input voltage for the sensing amplifier.

The above advantage results from the fact that the memory cell of the present invention enables the area of the capacitor portion to be maximized among various other types of cells. This is because, as compared with FIG. 3, the device of FIG. 8A does not require areas for the contact portions of the bit line BL. Further, the high-concentration diffusion layer, which serves as a reference potential line RL, is formed simultaneously with the formation by diffusion of source and drain electrodes of the switching transistor $Q_2$ without any contact, and presents increased reliability. Moreover, the diffusion layer generally presents a problem of increased parasitic capacity relative to ground when it is used as the bit line. When the diffusion layer is to be used as the reference potential line RL, as contemplated by the present invention, the capacity relative to ground presents no problem. Rather, the capacity of the reference line RL should preferably be great from the viewpoint of suppressing the noise. Therefore, no effort is required to reduce the capacity of this portion.

Figure 9:
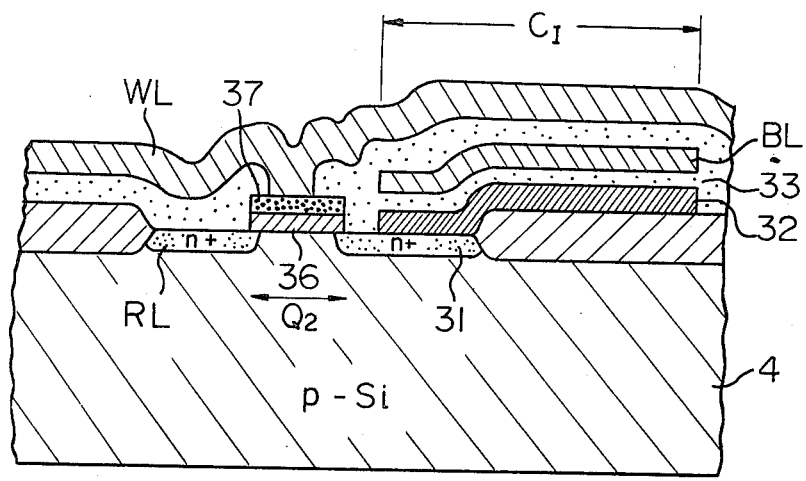
FIG. 9 is a sectional view of the semiconductor memory cell according to another embodiment of the present invention in which a word line is made of a metal wiring of the uppermost layer.

FIG. 9 illustrates another embodiment of the present invention in which the word line runs through the uppermost layer separately from the gate electrode. Although it is not allowed to stretch the capacitor electrode 32 and the bit line BL over the upper portion (gate portion) of the transistor $Q_2$, the word line WL can be formed in the layer which is higher than the bit line BL. Therefore, a metal or an alloy, such as metal silicide, can be used for the word line WL to reduce the resistance and to increase the operation speed. Though it is possible to use a metal for the word line WL even with the construction of FIG. 8A, the construction of FIG. 9 gives increased feasibility from the practical point of view. The bit line BL of FIG. 9 comprises a polycrystalline silicon layer, serves as a common electrode for the capacitors $C_I$, and stretches in a direction to cross the word line WL. Further, the gate electrode of the transistor $Q_2$ is formed by a polycrystalline silicon layer 37. In FIG. 9, the metallic wiring layer WL needs to be connected running over a step for each cell. The step, however, is considerably smaller than that of FIG. 3. Like the device of FIG. 8A, therefore, the device of FIG. 9 does not present a wire breakage problem.

Figure 10:
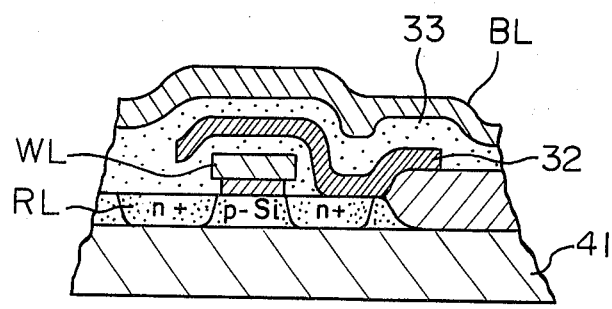
FIG. 10 is a sectional view of the semiconductor memory according to a further embodiment of the present invention.

Although the above-mentioned embodiments are based upon the prerequisite of using silicon bulk, use of a SOS (silicon on sapphire) substrate is effective to reduce the parasitic junction capacity $C_j$. FIG. 10 illustrates an embodiment therefor. In this case, the junction must be formed so deep as to reach the interface between sapphire and silicon. Moreover, the epitaxially grown layer on the semi-insulating substrate, such as GaAs layer, is effective to reduce the parasitic junction capacity $C_j$. In this case, the switching transistor may be of the MIS type or the Schottky barrier gate type.

According to the present invention, as mentioned above, the bit line is not composed of a diffusion layer. Therefore, the parasitic capacity, which decreases the output voltage, is reduced. Further, even when the bit line or the word line is to be composed of a metal wiring layer, the steps in the direction in which the metal wiring layer stretches are so small that the wiring layer is only slightly likely to break.

We claim:

1. A semiconductor memory device comprising:
a reference potential line;
a plurality of bit lines;
a plurality of word lines;
dynamic cells, each of said dynamic cells comprising a capacitor having first and second electrodes, and a field effect type switching transistor, said dynamic cells arrayed at intersecting points of said plurality of bit lines and said plurality of word lines, one of the source electrode and the drain electrode of said field effect type switching transistor being connected to said reference potential line, the other of the source electrode and the drain electrode being connected to said first electrode of said capacitor, each of said plurality of bit lines being commonly connected to said second electrodes of said capacitors of said dynamic cells arrayed along each of said plurality of bit lines, each of said plurality of word lines being commonly connected to the gate electrodes of said field effect type switching transistors of said dynamic cells arrayed along each of said plurality of word lines, the first electrode of said capacitor extending from said other of the source electrode and the drain electrode of said field effect type switching transistor, over the gate electrode, to said one of the source electrode and the drain electrode of said field effect type switching transistor.

2. A semiconductor memory device according to claim 1, wherein said capacitor comprises:

a first electrode layer connected to said one of the drain electrode and the source electrode of said field effect-type switching transistor;

a dielectric layer formed on said first electrode layer; and a second electrode layer formed on said dielectric layer and composed of one of a metal and an alloy such as silicide, said second electrode layer forming one of said plurality of bit lines which commonly forms the second electrode of each of the capacitors in the dynamic cells arrayed along said one of said plurality of bit lines, wherein the gate electrode of said field effect type switching transistor extends so as to cross said one of said plurality of bit lines, thereby to form one of said plurality of word lines, and wherein the region which forms said one of the source electrode and the drain electrode of said field effect type switching transistor extends parallel to said one of said plurality of said word lines to form said reference potential line.

3. A semiconductor memory device according to claim 2, wherein said first electrode layer and said gate electrode are composed of polycrystalline silicon.

4. A semiconductor memory device according to claim 2, wherein said first electrode layer and said gate electrode are composed of one of a metal and an alloy such as metal silicide.

5. A semiconductor memory device according to claim 1, wherein said capacitor comprises:

a first electrode layer connected to said one of the drain electrode and the source electrode of said field effect-type switching transistor; and a second electrode layer formed on said first electrode layer, said second electrode layer forming one of said plurality of bit lines which commonly forms the second electrode for each of the capacitors in the dynamic cells that are arrayed along said one of said plurality of bit lines, wherein the gate electrode of said field effect type switching transistor is connected to a wiring composed of one of a metal and an alloy such as silicide, said wiring extending so as to cross said one of said plurality of bit lines, thereby to form one of said plurality of word lines, and wherein the region which forms said one of the drain electrode and the source electrode of said field effect type switching transistor extends parallel to said one of said plurality of bit lines to form said reference potential line.

6. A semiconductor memory device according to claim 5, wherein said first electrode layer, said second electrode layer and said gate electrode are composed of polycrystalline silicon.

7. A semiconductor memory device according to claim 5, wherein said first electrode layer, said second electrode layer and said gate electrode are composed of one of a metal and an alloy such as silicide.

8. A semiconductor memory device according to claim 2 or 5, further comprising:

an insulating substrate; and a thin semiconductor layer formed on said insulating substrate, wherein said field effect type switching transistor is formed on said thin semiconductor layer, wherein said one of the drain electrode and the source electrode of said field effect type switching transistor is formed by a bottom portion of a diffusion layer, and wherein said bottom portion of the diffusion layer is formed by diffusing a portion of said thin semiconductor layer to the interface between said insulating substrate and said thin semiconductor layer.

9. A semiconductor memory device comprising:

a reference potential line;

first and second bit lines;

first and second word lines intersecting said first and second bit lines; and first, second, third and fourth memory cells arrayed at the intersecting points of said first and second bit lines and said first and second word lines, each of said first, second, third and fourth memory cells comprising:

a switching transistor, having a first electrode operatively connected to said reference potential line, having a second electrode operatively connected to a corresponding one of said first and second word lines, and having a third electrode; and a capacitor, having a first electrode connected to the third electrode of said switching transistor, and having a second electrode connected to a corresponding one of said first and second bit lines, said first electrode of said capacitor extending over said first, second and third electrodes of said switching transistor, so that the area of said capacitor is substantially the same as the area of said switching transistor.

10. A semiconductor memory device according to claim 9, wherein said switching transistor is a field effect transistor and wherein said first electrode is a drain electrode, said second electrode is a gate electrode and said third electrode is a source electrode.

11. A semiconductor memory device according to claim 9, wherein said switching transistor is a field effect transistor and wherein said first electrode is a source electrode, said second electrode is a gate electrode and said third electrode is a drain electrode.

* * * * *

UNITED STATES PATENT AND TRADEMARK OFFICE
CERTIFICATE OF CORRECTION

PATENT NO. : 4,419,743
DATED : DECEMBER 6, 1983
INVENTOR(S) : MASAO TAGUCHI ET AL.

It is certified that error appears in the above-identified patent and that said Letters Patent is hereby corrected as shown below:

Col. 6, line 53, "$V_C = V_{DD}$" should be --$V_C \approx V_{DD}$--.

Col. 7, line 7, "21b, 21b," should be --21b,--;

line 42, "$C_{ox}(C_D + D_j)$" should be --$C_{ox}(C_D + C_j)$--.

Col. 9, line 35, "is" (second occurrence) should be --or--;

line 52, "$C_S'$" should be --$C_S'$--;

line 55, "$C'_S$" should be --$C_S'$--.

Col. 10, lines 9 and 10, "$C'_B$" should be --$C_B'$--;

line 16, 17 and 18, "$\gamma = \dfrac{nC'_B}{C'_S} = \dfrac{nC_j}{C_I}$" should be $$-- \gamma = \frac{nC_B'}{C_S'} = \frac{nC_j}{C_I} -- ;$$

UNITED STATES PATENT AND TRADEMARK OFFICE
CERTIFICATE OF CORRECTION

PATENT NO. : 4,419,743  Page 2 of 2

DATED : DECEMBER 6, 1983

INVENTOR(S) : MASAO TAGUCHI ET AL.

It is certified that error appears in the above-identified patent and that said Letters Patent is hereby corrected as shown below:

Col. 10, line 43, "$\Delta Q = {}_0$" should be --$\Delta Q = \int_0$--; and

"dV" should be --dv--.

Col. 12, line 24, after "as" insert --a--.

Signed and Sealed this

First Day of May 1984

[SEAL]

Attest:

GERALD J. MOSSINGHOFF

Attesting Officer

Commissioner of Patents and Trademarks